United States Patent
Stern (10) Patent No.: US 8,354,282 B2
(45) Date of Patent: Jan. 15, 2013

(54) VERY HIGH TRANSMITTANCE, BACK-ILLUMINATED, SILICON-ON-SAPPHIRE SEMICONDUCTOR WAFER SUBSTRATE FOR HIGH QUANTUM EFFICIENCY AND HIGH RESOLUTION, SOLID-STATE, IMAGING FOCAL PLANE ARRAYS

(76) Inventor: Alvin Gabriel Stern, Newton, MA (US)

( * ) Notice: Subject to any disclaimer, the term of this patent is extended or adjusted under 35 U.S.C. 154(b) by 138 days.

(21) Appl. No.: 12/931,363

(22) Filed: Jan. 31, 2011

(65) Prior Publication Data

US 2012/0193636 A1  Aug. 2, 2012

(51) Int. Cl.
*H01L 21/00* (2006.01)
*H01L 29/32* (2006.01)

(52) U.S. Cl. ............. 438/22; 438/24; 438/72; 438/459; 257/76; 257/77; 257/79; 257/E21.102; 257/E29.089; 372/50.21; 136/255; 136/256

(58) Field of Classification Search ............ 438/22, 438/24, 72, 459; 257/76, 77, 79, E21.102, 257/E29.089; 372/50.21; 136/255, 256
See application file for complete search history.

(56) References Cited

U.S. PATENT DOCUMENTS

| | | | |
|---|---|---|---|
| 2006/0197096 A1* | 9/2006 | Kerdiles et al. | 257/79 |
| 2011/0012131 A1* | 1/2011 | Yamazaki | 257/77 |
| 2012/0051383 A1* | 3/2012 | Stern | 372/50.21 |
| 2012/0119332 A1* | 5/2012 | Atanackovic | 257/616 |

* cited by examiner

*Primary Examiner* — Dao H Nguyen (57) ABSTRACT

An advanced, very high transmittance, back-illuminated, silicon-on-sapphire wafer substrate design is presented for enabling high quantum efficiency and high resolution, silicon or silicon-germanium avalanche photodiode detector arrays. The wafer substrate incorporates a stacked antireflective bilayer between the sapphire and silicon layers, comprised of single crystal aluminum nitride (AlN) and non-stoichiometric, silicon rich, amorphous silicon nitride ($a\text{-}SiN_{X<1.33}$), that provides optimal refractive index matching between sapphire and silicon. A one quarter wavelength, magnesium fluoride ($\lambda/4\text{-}MgF_2$) antireflective layer deposited on the back surface of the thinned sapphire provides refractive index matching at the air-sapphire interface. Selecting a composition of $x=0.62$ for $a\text{-}SiN_x$, tunes an optimal refractive index for the layer. Selecting design thicknesses of 52 nm for single crystal AlN, 30 nm for $a\text{-}SiN_{0.62}$, and 120 nm for $\lambda/4\text{-}MgF_2$ yields a back-illuminated optical transmittance $T>50\%$ for 250-300 nm, $T>70\%$ for 300-400 nm and $T>90\%$ for 400-1100 nm.

9 Claims, 7 Drawing Sheets

VERY HIGH TRANSMITTANCE, BACK-ILLUMINATED, SILICON-ON-SAPPHIRE SEMICONDUCTOR WAFER SUBSTRATE FOR HIGH QUANTUM EFFICIENCY AND HIGH RESOLUTION, SOLID-STATE, IMAGING FOCAL PLANE ARRAYS

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

For the purposes of imaging a scene, at low ambient illumination levels using a focal plane array comprised of solid-state detector devices, it is beneficial for the individual detectors in the array to be sensitive to light over a broad wavelength range and at single photon intensity levels. To support the fabrication of such an array of highly sensitive solid-state light detectors over broad spectral range, the back-illuminated semiconductor wafer substrate on which the detector devices are fabricated should be capable of transmitting light into the detectors with high efficiency from the ultraviolet to the midwave infrared for enabling high quantum efficiency detectors. The back-illumination approach of semiconductor detectors through the transparent supporting wafer substrate is the preferred approach for fabricating large area, solid-state, imaging focal plane arrays due to a higher attainable quantum efficiency and sensitive-area-fill-factor for such detectors compared to front-illuminated detector arrays. Back-illuminated detector arrays can be flip-chip bump-bonded to CMOS readout integrated circuits (ROICs) that control detector operation. Using highly sensitive detector arrays of avalanche photodiodes (APDs) is the preferred approach for implementing compact, solid-state, single photon sensitive, focal plane array (FPA) imagers. The semiconductor wafer substrate should therefore support the light detecting elements to be fabricated with small pixel pitch for enabling high resolution arrays, by providing a means for optical crosstalk isolation between the APD detector elements. Optical crosstalk in solid-state avalanche detector arrays results from light emission during impact ionization that can erroneously trigger neighboring detector pixels in the array and increase the overall detector noise. In addition, the semiconductor wafer substrate should support a high quality single crystal active semiconductor material layer with low defect density, in which light detecting elements characterized by low dark current can be fabricated.

The present invention describes a method for implementing a very high transmittance, back-illuminated, silicon-on-sapphire semiconductor wafer substrate to support the fabrication of large scale, high quantum efficiency and high resolution silicon (Si) or silicon germanium (SiGe) avalanche photodiode focal plane array (APD-FPA) imagers. The very high transmittance silicon-on-sapphire substrate incorporates an antireflective bilayer comprised of refractive index matched single crystal aluminum nitride (AlN) in conjunction with amorphous, non-stoichiometric, silicon rich, silicon nitride (a-SiN$_{X<1.33}$), designated as (AlN/a-SiN$_{X<1.33}$), between the sapphire and silicon to improve the transmittance of light from sapphire into the silicon detector device layer. An amorphous, one quarter wavelength magnesium fluoride ($\lambda/4$-MgF$_2$) antireflective layer deposited on the back surface of the thinned sapphire wafer is meant to provide refractive index matching and thereby improve the optical transmittance from the ambient into the sapphire. The single crystal AlN component of the antireflective bilayer can be grown by epitaxy in non-polar A-plane orientation on semipolar R-plane sapphire substrates or grown in polar C-plane orientation on lower cost C-plane sapphire substrates. The amorphous, non-stoichiometric a-SiN$_{X<1.33}$ component of the antireflective bilayer can be deposited by low pressure chemical vapor deposition (LPCVD) for example, on a full thickness (100) silicon wafer substrate followed by wafer bonding of the non-stoichiometric a-SiN$_{X<1.33}$ on (100) silicon, to the single crystal AlN-on-sapphire. The (100) silicon wafer can be subsequently thinned using lapping and polishing to an appropriate thickness for fabrication of detector devices.

Using non-stoichiometric a-SiN$_{X<1.33}$ for the antireflective layer is necessary, to provide proper refractive index matching in conjunction with single crystal AlN, between the sapphire and silicon. The stoichiometric a-SiN$_{X=1.33}$ or a-Si$_3$N$_4$ has a refractive index that is too low to provide adequate refractive index matching between the AlN and silicon. Moreover, non-stoichiometric, silicon-rich a-SiN$_{X<1.33}$ has a lower tensile strain than stoichiometric a-SiN$_{X=1.33}$ when deposited on silicon and this helps to reduce the injection of defects into the silicon device layer. In addition, although a-SiN$_{X<1.33}$ is meant to function primarily as an antireflective layer in the present invention, it can also perform the important secondary function of passivating the (100) silicon surface and silicon bulk. If the a-SiN$_{X<1.33}$ thin film layer is deposited at a sufficiently low temperature of 200-450° C. by plasma enhanced chemical vapor deposition (PECVD) or hot filament chemical vapor deposition (HFCVD) methods for example, and therefore still retains hydrogen from the gaseous precursor chemicals used for deposition, the hydrogen will diffuse out of the a-SiN$_{X<1.33}$ layer and into the silicon to passivate the silicon surface and also the silicon semiconductor bulk defects.

The very high transmittance, back-illuminated silicon-(AlN/a-SiN$_{X<1.33}$)-sapphire substrate with $\lambda/4$-MgF$_2$ backside antireflective layer, readily supports fabrication of silicon mesa detectors with exposed (111) side planes and fixed crystallographic angle $\phi_C=54.7°$ between (100) and (111) silicon planes, by liquid anisotropic etching using tetramethyl ammonium hydroxide (TMAH) to define the mesa APD detector array. The AlN/a-SiN$_{X<1.33}$ antireflective bilayer and sapphire act as natural etch stopping layers to enable fabrication of highly uniform silicon mesa pixels by crystallographic etching. In addition, monolithic sapphire microlenses can be fabricated beneath each mesa APD detector pixel in the thinned sapphire to focus light under the full height of the detector mesas. The space between mesa APD detector pixels can be filled by an aluminum (Al) or copper (Cu) metal anode grid, forming a common anode electrical connection at the base of each silicon detector mesa. The Al metal common anode grid also performs the important secondary function of providing optical crosstalk isolation between adjacent APD detectors by blocking light emitted during the avalanche gain process.

In the relatively recent past, it has become possible to fabricate solid-state arrays of silicon avalanche photodiodes optimized to operate either in linear mode or in non-linear Geiger-mode and capable of providing single photon sensitivity over a wavelength range from ultraviolet (UV) to near infrared (NIR). Focal plane arrays comprised of such linear or Geiger-mode silicon APD detectors, however, have only been fabricated in less than optimal substrate material systems due to the unavailability of a fully optimized wafer substrate, inherently capable of supporting high broadband quantum efficiency and high resolution, back-illuminated detector arrays with monolithic microlenses and optical crosstalk isolation between adjacent pixels in the array. To date, no effective substrate technology exists that inherently provides nearly 100% broadband, back-illuminated optical transmittance into the silicon semiconductor detector device layer, while supporting small pixel pitch, high resolution APD detector arrays with monolithic microlenses and optical crosstalk isolation between adjacent pixels.

As illustrated in U.S. Pat. No. 7,271,376, the design of a silicon avalanche photodiode control circuit and detector device uses a silicon-on-insulator wafer where the starting substrate is described to be either the handle wafer of a p-silicon-on-insulator wafer or a p-Si substrate with a $SiO_2$ insulating layer. This substrate design however, is not optimized to provide nearly 100% back-illuminated optical transmittance into the APD detector or to provide optical crosstalk isolation that will enable high resolution arrays.

As illustrated in U.S. Pat. No. 7,268,339, a method is described for forming semiconductor avalanche photodiodes in an n-doped semiconductor wafer using a plurality of doped, opposing trenches in the top and bottom surfaces of the substrate wafer. The substrate design is not optimized to provide nearly 100% back-illuminated optical transmittance into the APD detector or to provide optical crosstalk isolation that will enable high resolution arrays.

As illustrated in U.S. Pat. No. 6,864,965, the imaging focal plane array supports dual-mode operation in both passive and active detection modes using LADAR pulses for the active mode. Switching between detection modes is accomplished by increasing the voltage bias across the detector so as to increase the gain and therefore sensitivity to the active laser pulse returns from objects in a scene. The mercury-cadmium-telluride (HgCdTe) detector pixels are shown to be fabricated in a semiconductor substrate having an antireflective coating applied to the surface. This substrate design is not optimized to provide nearly 100% broadband, back-illuminated optical transmittance into the APD detector or to provide optical crosstalk isolation that will enable high resolution arrays.

In another embodiment of a position sensitive solid-state detector with internal gain, U.S. Pat. No. 6,781,133 B2, the invention describes a detection device and signal readout scheme, that uses an n-silicon substrate that is doped with p-materials using deep diffusion. This substrate design is not optimized to provide nearly 100% broadband, back-illuminated optical transmittance into the APD detector or to provide optical crosstalk isolation that will enable high resolution arrays.

In another embodiment, U.S. Pat. No. 5,892,575, a method and apparatus for imaging a scene are described for resolving the 3-D spatial structure in the scene. The light source emits pulses of laser light toward the object being imaged and the detector system includes an optical system and an array of light detectors operating in non-linear Geiger-mode. The optical system collects a portion of the light scattered off of objects in the scene and directs the collected light toward the array of light detectors. The invention refers to a monolithic array of light detectors operating in the non-linear Geiger-mode and does not describe an optimal substrate design for fabricating the Geiger-mode APD detectors that is capable of providing nearly 100% broadband, back-illuminated optical transmittance into the APD detectors or to provide optical crosstalk isolation that will enable high resolution arrays.

In another embodiment, U.S. Pat. No. 5,757,057, a method for fabricating a large array of avalanche photodiodes using a plurality of pixel contacts that are isolated electrically by one or more isolation structures is revealed. The avalanche photodiode pixels, however, are fabricated in a semiconductor substrate comprised of two oppositely doped layers and is not optimized to provide nearly 100% broadband, back-illuminated optical transmittance into the APD detectors or to provide optical crosstalk isolation that will enable high resolution arrays.

In another embodiment, U.S. Pat. No. 5,438,217, a planar avalanche photodiode device array is realized using a planar block of n-type semiconductor having a plurality of p-type wells in the block surrounded by a foundation of n-type semiconductor material. This substrate design is not optimized to provide nearly 100% broadband, back-illuminated optical transmittance into the APD detector or to provide optical crosstalk isolation that will enable high resolution arrays.

In another embodiment, U.S. Pat. No. 4,177,084, a method for producing a low defect layer of silicon on a sapphire substrate is provided. The silicon-on-sapphire (SOS) wafer is formed by epitaxial deposition of (100) silicon directly on the R-plane sapphire substrate followed by implanting of Si ions near the higher defect density silicon-sapphire interface. Subsequent annealing of the amorphised silicon near the sapphire surface using the low defect density silicon near the top of the epitaxial layer as a template for regrowth, produces an improved quality silicon device layer near the sapphire. The substrate fabrication approach, however, does not describe a method of providing nearly 100% broadband, back-illuminated optical transmittance through the sapphire substrate into the silicon semiconductor layer where APD detectors can be fabricated.

In another embodiment, U.S. Pat. No. 5,441,591, a method for fabricating a silicon-on-sapphire wafer is provided using direct wafer bonding of a silicon wafer to a sapphire wafer by application of pressure and elevated temperature. The full thickness silicon wafer is subsequently thinned by chemical mechanical polishing to an appropriate thickness for fabricating semiconductor devices. The substrate fabrication approach, however, does not describe a method of providing nearly 100% broadband, back-illuminated optical transmittance through the sapphire substrate into the silicon APD detector.

Note that the above solid-state, semiconductor, avalanche detectors and silicon-on-sapphire substrate fabrication approaches do not envision, nor describe a method for realizing an optimal substrate design for silicon APD-FPAs that provides nearly 100% broadband, back-illuminated optical transmittance into the APD detectors and provides an effective means for optical crosstalk isolation between detectors to enable high resolution arrays.

BRIEF SUMMARY OF THE INVENTION

The hurdles associated with realizing an optimized semiconductor wafer substrate capable of supporting the fabrication of large scale, high quantum efficiency and high resolution, back-illuminated silicon (Si) and silicon-germanium (SiGe) avalanche photodiode (APD) arrays can be overcome by using an advanced silicon-on-sapphire (SOS) material system. The main problem of transmitting broadband light through the transparent sapphire substrate into the silicon detector device layer in conventional silicon-on-sapphire wafer substrates, occurs due to the optical reflection losses at the sapphire-silicon and the air-sapphire material interfaces, resulting from refractive index mismatch between the layers.

The advanced silicon-on-sapphire substrate that is the subject of the present invention incorporates an antireflective bilayer comprised of single crystal aluminum nitride (AlN) and amorphous, non-stoichiometric silicon nitride (a-SiN$_{X<1.33}$) referred to as (AlN/a-SiN$_{X<1.33}$) between sapphire and silicon. By selecting the proper composition for the non-stoichiometric, silicon rich a-SiN$_{X<1.33}$ layer, thereby also tuning its refractive index, it becomes possible to provide nearly optimal refractive index matching in conjunction with the single crystal AlN, between the sapphire substrate and the silicon detector device layer. Selecting the proper thickness for the AlN as well as the proper thickness and stoichiometry for a-SiN$_{X<1.33}$ will result in nearly optimal broadband optical transmittance from sapphire into silicon. An amorphous, one quarter wavelength magnesium fluoride ($\lambda$/4-MgF$_2$) antireflective layer deposited on the back surface of the thinned sapphire wafer improves the optical transmittance from the ambient into the sapphire.

In one embodiment of the invention, the single crystal AlN component of the (AlN/a-SiN$_{X<1.33}$) antireflective bilayer can be grown by epitaxy in A-plane orientation on an R-plane sapphire wafer substrate. In a second embodiment, lower cost C-plane sapphire substrates can be used to grow polar C-plane AlN antireflective layers. The amorphous, non-stoichiometric a-SiN$_{X<1.33}$ component of the antireflective bilayer pair can be deposited on a full thickness (100) silicon wafer substrate followed by wafer bonding of the a-SiN$_{X<1.33}$ on (100) silicon, to the single crystal AlN-on-sapphire. The (100) silicon wafer can be subsequently thinned by lapping and polishing to an appropriate design thickness ranging from 10-50 μm for detector device fabrication.

The very high transmittance, back-illuminated silicon-(AlN/a-SiN$_{X<1.33}$)-sapphire substrate with $\lambda$/4-MgF$_2$ back-side antireflective layer, readily supports fabrication of silicon mesa detectors with exposed (111) side planes and fixed crystallographic angle $\phi_C$=54.7° between (100) and (111) silicon planes, by liquid anisotropic etching using tetramethyl ammonium hydroxide (TMAH) to define the APD detector array. The AlN/a-SiN$_{X<1.33}$ antireflective bilayer and sapphire act as natural etch stopping layers to enable fabrication of highly uniform silicon mesa pixels by crystallographic etching. In addition, monolithic sapphire microlenses can be fabricated beneath each mesa APD detector pixel in the thinned sapphire to focus light under the full height of the detector mesas. The space between mesa APD detector pixels can be filled by an aluminum (Al) or copper (Cu) metal anode grid, forming a common anode electrical connection at the base of each silicon detector mesa. The Al metal common anode grid also performs the important secondary function of providing optical crosstalk isolation between adjacent APD detectors by blocking light emitted during the avalanche gain process.

The design of the very high transmittance, back-illuminated silicon-(AlN/a-SiN$_{X<1.33}$)-sapphire substrates allows the complete substrate to be fabricated prior to the fabrication of Si or SiGe APD detectors in the silicon device layer, since none of the material layers in the substrate including AlN, a-SiN$_{X<1.33}$ and sapphire will be adversely affected by subsequent APD detector device fabrication in the silicon mesas using conventional silicon processing technology (e.g. thermal oxidation, diffusion of dopant impurities, deposition and metallization steps). If required, the $\lambda$/4-MgF$_2$ back-side antireflective layer can be protected by depositing an SiO$_2$ cladding layer prior to the APD detector array fabrication, that can be etched off using liquid HF once the detector processing has been completed. Being able to fully fabricate and characterize the very high transmittance, back-illuminated silicon-(AlN/a-SiN$_{X<1.33}$)-sapphire substrates with back-side $\lambda$/4-MgF$_2$ antireflective layer prior to fabricating the silicon detectors is cost effective, first, by allowing wafer substrates to be optimally fabricated, separately and independently from the detector devices, and second, by preventing the consumption of expensive semiconductor gases to manufacture detectors in unfinished wafer substrates that might not pass quality standards once fully fabricated.

In summary, an optimized silicon-(AlN/a-SiN$_{X<1.33}$)-sapphire substrate with back-side $\lambda$/4-MgF$_2$ antireflective layer, having a properly designed thickness of AlN and MgF$_2$ layers as well as properly designed thickness and composition of a-SiN$_{X<1.33}$, can achieve nearly 100% back-illuminated optical transmittance over a broad wavelength range from 250-1100 nm. The very high transmittance substrate will support the fabrication of high quantum efficiency and high resolution, back-illuminated silicon and silicon-germanium APD detector arrays with effective optical crosstalk isolation between neighboring pixels in the array. The silicon-(AlN/a-SiN$_{X<1.33}$)-sapphire substrate with back-side $\lambda$/4-MgF$_2$ antireflective layer can be fabricated separately and independently from the detector device arrays. Thus, there is no need to potentially waste expensive resources to manufacture detector arrays in unfinished wafer substrates that might not pass quality standards once fully fabricated.

BRIEF DESCRIPTION OF THE SEVERAL VIEWS OF THE DRAWING

These and other features of the subject of the invention will be better understood with connection with the Detailed Description of the Invention in conjunction with the Drawings, of which.

DETAILED DESCRIPTION OF THE INVENTION

Figure 1:
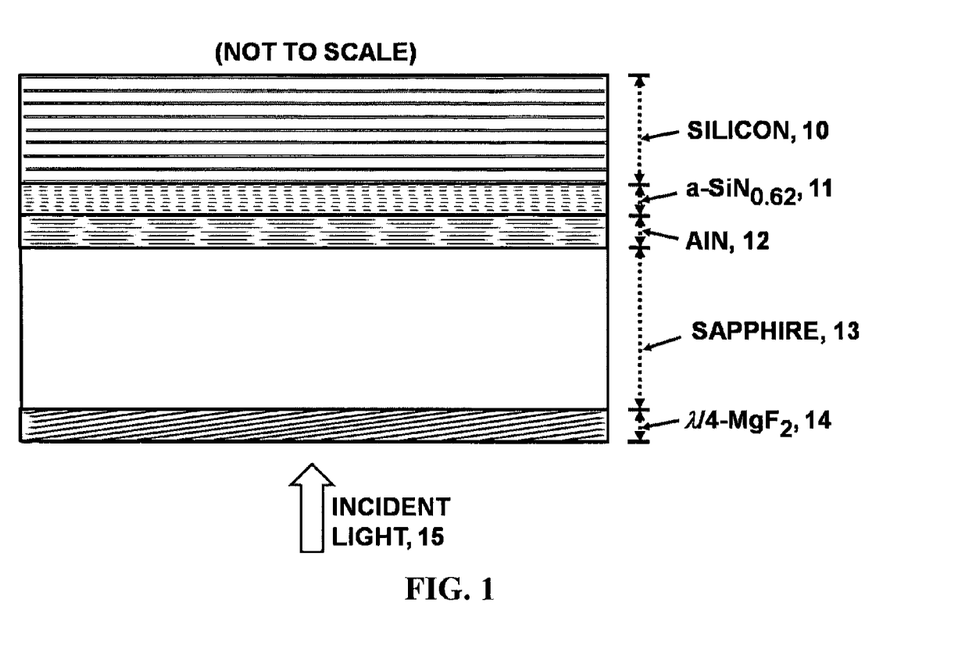
FIG. 1 illustrates the stacking order and optimal thickness of material layers in the very high transmittance, back-illuminated, silicon-(AlN/a-SiN$_{X=0.62}$)-sapphire wafer substrate with $\lambda$/4-MgF$_2$ back-side antireflective layer.

Referring to FIG. 1, a depiction of the very high transmittance, back-illuminated, silicon-on-sapphire semiconductor wafer substrate is shown in a non-scale rendering, consisting of an ordered stacking of material layers including the top most single crystal silicon (Si) semiconductor layer 10, non-stoichiometric, silicon rich, amorphous silicon nitride antireflective layer with nitrogen to silicon ratio N:Si=0.62 or a-SiN$_{0.62}$ 11, single crystal aluminum nitride (AlN) antireflective layer 12, optically transparent single crystal sapphire ($\alpha$-Al$_2$O$_3$) wafer substrate 13, and back-side one quarter wavelength thick magnesium fluoride ($\lambda/4$-MgF$_2$) antireflective layer 14. Solid-state detector devices are meant to be fabricated in the silicon 10 semiconductor layer and back-illuminated by light 15 incident from the back-side of the substrate that traverses the optimal thickness material layers $\lambda/4$-MgF$_2$, sapphire, AlN and a-SiN$_{0.62}$ with minimal reflection and absorption losses, to enter the silicon 10 active semiconductor layer and impinge on the light detectors.

Figure 2:
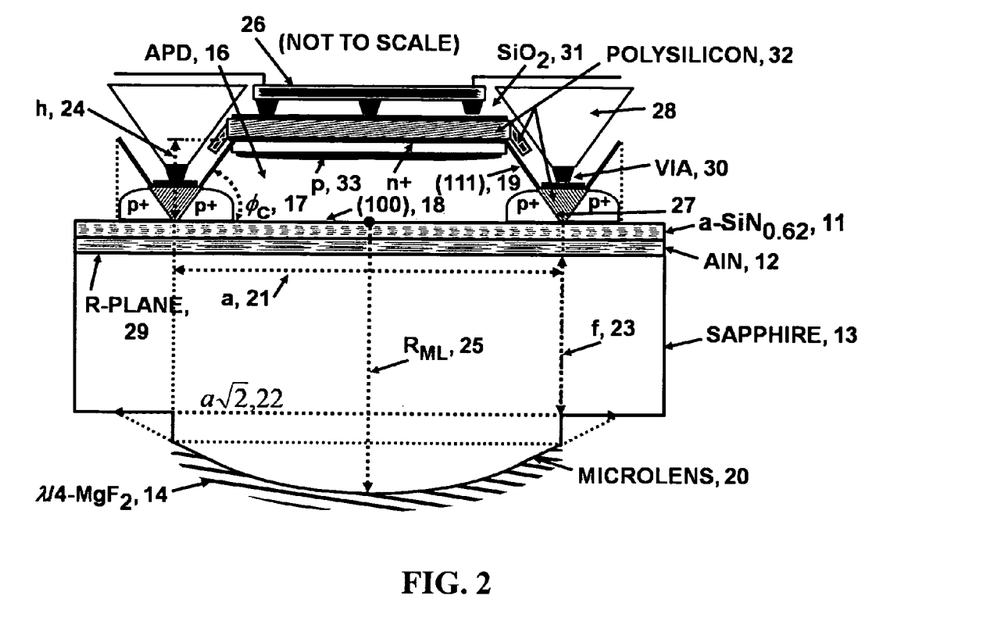
FIG. 2 is a diagrammatic cross-sectional illustration of a square 27 μm side length, mesa APD detector pixel fabricated on very high transmittance, back-illuminated, crystallographically etched, silicon-(AlN/a-SiN$_{0.62}$)-(R-plane)-sapphire substrate that supports optical crosstalk isolation between adjacent APD detectors in the array.

Referring to FIG. 2, the principal advantage of very high transmittance, back-illuminated silicon 10-(AlN/a-SiN$_{0.62}$) 12/11-sapphire 13 substrates with $\lambda/4$-MgF$_2$ 14 back-side antireflective layer is depicted, where silicon mesa avalanche photodiode (APD) detector pixels 16 can be readily fabricated using anisotropic liquid etching with tetramethyl ammonium hydroxide (TMAH) for example, to define large arrays of highly uniform square based pyramidal silicon mesas, since the (AlN/a-SiN$_{0.62}$) 12/11-sapphire 13 substrate acts as a natural etch stopping layer. The anisotropically etched silicon pixel mesa 16 exhibits the characteristic angle $\phi_c$=54.7 degrees 17 between the (100) 18 and (111) 19 silicon planes. A spherical, monolithic sapphire microlens 20 aligned beneath the silicon mesa pixel and fabricated using inductively coupled plasma etching (ICP) for example, focuses light under the full height of the detector to compensate the reduced height silicon sidewalls. Dimensions of the pixel include square pixel side length 21 of a=27 μm, with corresponding diagonal dimension 22, f=50 μm 23, mesa height h=10 μm 24, and microlens radius R$_{ML}$=53.59 μm 25.

The avalanche photodiode (APD) detector is fabricated in the silicon mesa 16. The silicon APD cathode terminal 26 is electrically independent for each detector in the array. Silicon APD detectors however, share a common front-side anode contact 27, made locally at the base of each device mesa. A low resistance aluminum (Al) anode or copper (Cu) metal anode grid 28 fills the space between pixels and also functions to inhibit optical crosstalk by shielding adjacent detectors from stray photons generated during the avalanche gain process. The figure also shows the R-plane surface of sapphire 29, tungsten vias 30, SiO$_2$ electrical isolation layer 31, n+ and p+ doped APD cathode and anode polysilicon 32 respectively and the p-type diffused high electric field APD avalanche region 33.

Thus, the silicon-(AlN/a-SiN$_{0.62}$)-sapphire substrate with $\lambda/4$-MgF$_2$ back-side antireflective layer, supports an effective means for creating electrical isolation and optical crosstalk isolation between APD detectors at micrometer scales in an array using crystallographic etching, to support low noise, high resolution, back-illuminated imaging focal plane arrays. The possibility of fabricating a monolithic sapphire microlens in the sapphire substrate aligned beneath each mesa pixel, improves the APD detector quantum efficiency by focusing optical k-vectors under the full height of silicon and away from the optical dead space between pixels, thereby also providing 100% array sensitive-area-fill-factor.

Figure 3:
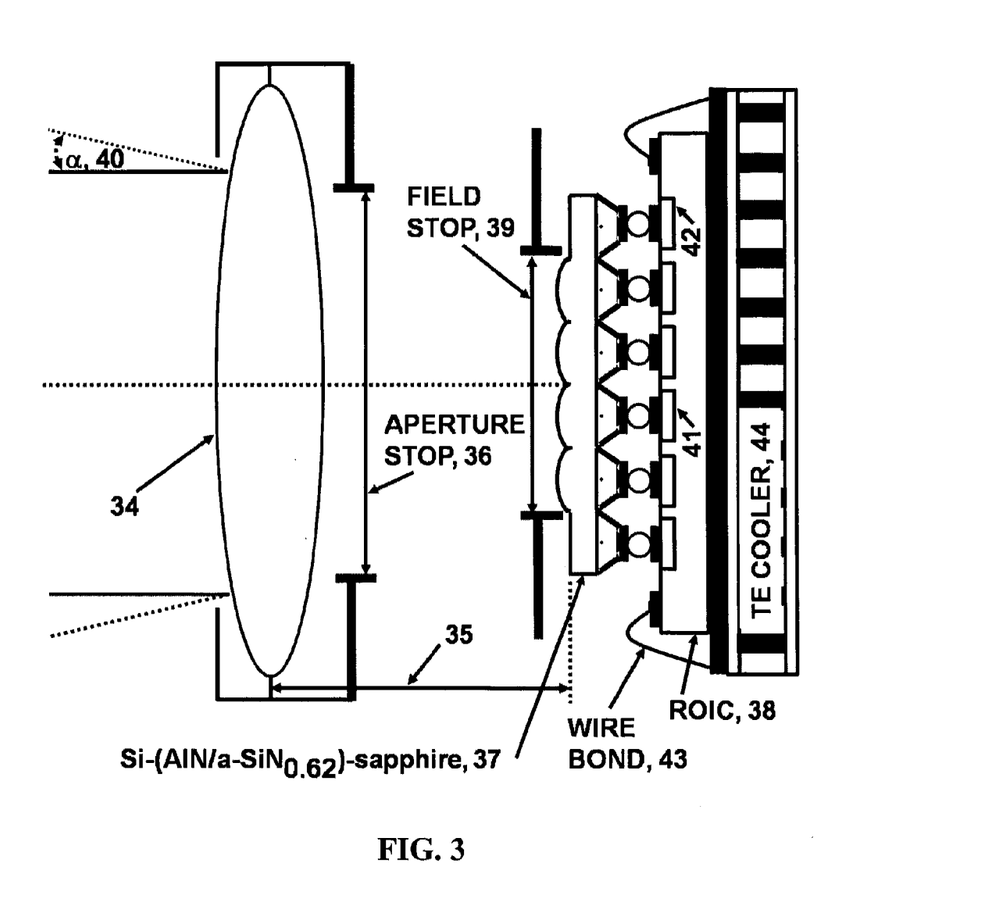
FIG. 3 illustrates the main components of a camera system utilizing a high sensitivity, solid-state, avalanche photodiode focal plane array imager, with mesa APD detectors fabricated on very high transmittance, back-illuminated silicon-(AlN/a-SiN$_{0.62}$)-sapphire substrate with $\lambda$/4-MgF$_2$ back-side antireflective layer, that is flip-chip bump-bonded to a CMOS readout integrated control circuit.

Referring to FIG. 3, the principal advantage of using a very high transmittance, back-illuminated, Si—(AlN/a-SiN$_{0.62}$)-sapphire wafer substrate with $\lambda/4$-MgF$_2$ back-side antireflective layer for fabricating a solid-state APD detector array is depicted, where a high quantum efficiency and high resolution, all solid-state APD focal plane can be realized by use of a simple camera lens 34 with focal length F=0.21 meters 35, an aperture stop of diameter D=3.75 cm 36 and a focal plane array (FPA) consisting of a very high transmittance, back-illuminated Si—(AlN/aSiN$_{0.62}$)-sapphire APD detector array chip 37 that is flip-chip bump-bonded to a CMOS readout integrated circuit (ROIC) 38. The light sensitive, square area of the FPA sets the field stop dimension 39, that in turn sets the angular field of view of the camera 40. The CMOS-ROIC 38 includes pixel circuits 41 and a top level metal anode ring 42 around the periphery of the pixel circuit array. The CMOS-ROIC 38 is shown wire bonded 43 to a ceramic interposer that is mounted to a thermoelectric cooler 44. The camera lens 34 allows the area in a scene subtending the field of view to be spatially conjugated back to the detector array.

The approach presented here for implementing a highly compact, back-illuminated, high quantum efficiency and high resolution, solid-state, APD focal plane array imager by using a very high transmittance Si—(AlN/a-SiN$_{0.62}$)-sapphire substrate with $\lambda/4$-MgF$_2$ back-side antireflective layer, is novel. The design approach presented here, represents a significant advancement in high sensitivity, wide dynamic range, passive or active 2-D and 3-D imaging technology using large area, high quantum efficiency and high resolution arrays of silicon or silicon-germanium avalanche photodiodes that can operate in both linear mode and in single photon sensitive Geiger-mode.

Figure 4:
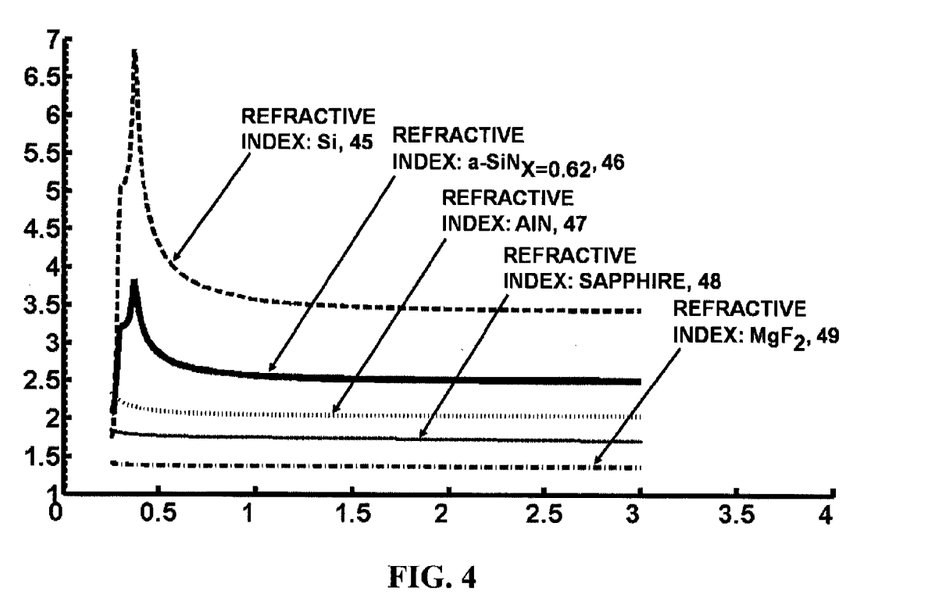
FIG. 4 is the calculated refractive index matching for the very high transmittance, back-illuminated silicon-(AlN/a-SiN$_X$)-sapphire wafer substrate with $\lambda$/4-MgF$_2$ back-side antireflective layer from FIG. 1, showing correct refractive index matching for a composition ratio of X=0.62 in silicon rich, silicon nitride.

Referring now to FIG. 4, the refractive index as a function of optical wavelength given in micrometers is shown for the different material layers that comprise the very high transmittance, back-illuminated Si 45-(AlN/a-SiN$_{0.62}$) 47/46-sapphire 48 substrate with $\lambda/4$-MgF$_2$ 49 back-side antireflective layer. The principal design challenge for maximizing the back-illuminated optical transmittance for the novel substrate consists first, of adjusting correctly the thickness of the $\lambda/4$-MgF$_2$ 49 back-side antireflective layer to provide proper refractive index matching between the ambient or air, and sapphire and second, adjusting the thickness of AlN 47 and the thickness as well as the composition of silicon rich, non-stoichiometric a-SiN$_{X<1.33}$, thereby also adjusting its refractive index 46, for optimal refractive index matching to be provided by the (AlN/a-SiN$_{X<1.33}$) antireflective bilayer between sapphire 48 and silicon 45 material layers.

Calculating the appropriate composition of the a-SiN$_{X<1.33}$ component of the antireflective bilayer between sapphire and silicon that provides appropriate refractive index matching over a broad optical wavelength range in conjunction with AlN, can be accomplished by using the experimental results of Gardeniers et. al. who studied the material properties of non-stoichiometric, silicon rich, a-SiN$_{X<1.33}$ films they deposited using low pressure chemical vapor deposition (LPCVD) from reaction of dichlorosilane (DCS) and ammonia (NH$_3$) at an elevated temperature between 700-900 degrees Celsius. Although their goal was to optimize the a-SiN$_{X<1.33}$ thin films for microelectromechanical systems (MEMS) applications requiring low tensile strain, their results also confirmed an important theoretical model described by Makino and Stein et. al. separately, predicting the a-SiN$_{X\leq1.33}$ thin film refractive index as a function of the nitrogen to silicon ratio (x=N:Si) in the film. Their model assumes that the refractive index of a-SiN$_{X\leq1.33}$ films is a "bond-density-weighted linear combination" of amorphous silicon or a-Si and a-SiN$_{1.33}$ reference refractive indices and is given as:

$$n = \frac{[(4/x) - 3]n_0 + 6n_{1.33}}{(4/x) + 3}$$

where n$_0$ represents the refractive index of a-Si and n$_{1.33}$ represents the refractive index of stoichiometric a-SiN$_{1.33}$. This equation in combination with the known refractive index as a function of wavelength curve or Sellmeier relation for stoichiometric a-SiN$_{1.33}$ that provides the value of n$_{1.33}$, may then be used to calculate the optimal value of the nitrogen to silicon ratio x=N:Si in a-SiN$_X$ that provides optimal refractive index matching 46, between sapphire 48 and silicon 45 in conjunction with AlN 47. A calculated nearly optimal refractive index as a function of optical wavelength for the a-SiN$_X$ component of the antireflective bilayer is provided when the nitrogen to silicon ratio in the layer is given as N:Si=0.62 or x=0.62 46 as shown in FIG. 4. Slight variations on the x=0.62, calculated value of the nitrogen to silicon ratio in a-SiN$_X$ are also possible, in order for example to provide closer refractive index matching over a more limited wavelength range.

Figure 5:
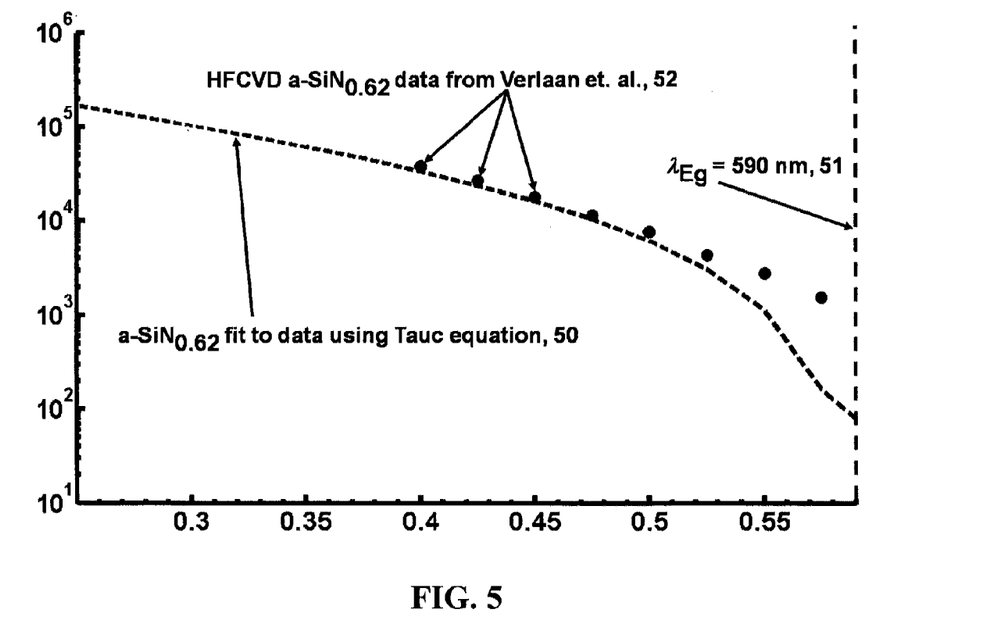
FIG. 5 is the calculated absorption coefficient as a function of wavelength for the optimal composition, silicon rich a-SiN$_{0.62}$ component of the antireflective bilayer between sapphire and silicon from FIG. 1, and confirms that minimal optical loss from absorption in the thin (<50 nm thick) a-SiN$_{0.62}$ layer can be expected over the Tauc absorption region from 250 nm to $\lambda_{Eg}$=590 nm.

Referring now to FIG. 5, the absorption coefficient with units of 1/cm as a function of the optical wavelength in micrometers is calculated over the Tauc absorption region (from 250–$\lambda_{Eg}$=590 nm 51) for the optimal composition a-SiN$_{0.62}$ 50 component of the antireflective bilayer that provides refractive index matching between sapphire and silicon. It is necessary to be able to predict the absorption coefficient as a function of the optical wavelength 50 for the a-SiN$_{0.62}$ material component of the antireflective bilayer, over the Tauc absorption region to verify its transparency near the short wavelength or high absorption region of the material. Ideally the a-SiN$_{0.62}$ will be fully transparent and no light will be absorbed in the layer from 250-1100 nm.

Data for the extinction coefficient as a function of optical wavelength was not collected in the a-SiN$_X$ samples that Gardeniers et. al. deposited at high temperature using LPCVD, however, it is still possible to infer a worst case scenario for the absorbance of the a-SiN$_{0.62}$ component of the bilayer (from FIG. 446) using the data collected by Verlaan et. al. who used hot filament chemical vapor deposition (HFCVD) to deposit a-SiN$_{0.62}$ which has identical stoichiometry to the nearly optimal antireflective layer (from FIG. 446). Verlaan et. al. measured the extinction coefficient of the HFCVD deposited a-SiN$_{0.62}$ sample over the visible wavelength range from 400-650 nm 52. Although HFCVD as used by Verlaan et. al. maintained the substrate at a lower temperature of 230° C. during deposition compared to high temperature LPCVD used by Gardeniers et. al., the resulting a-SiN$_X$ from HFCVD has a density approaching that of material deposited by high temperature LPCVD while retaining more hydrogen. Despite these differences between LPCVD and HFCVD deposited thin films, the lower quality HFCVD deposited a-SiN$_{0.62}$ sample measured by Verlaan et. al. may be used to infer the worst expected case for the absorbance as a function of wavelength of the LPCVD deposited a-SiN$_{0.62}$ material component of the antireflective bilayer (from FIG. 446).

Since Verlaan et. al. only measured the extinction coefficient for HFCVD deposited a-SiN$_{0.62}$ from 400-650 nm 52, it is possible from their data to calculate the optical bandgap E$_{g-opt}$ of a-SiN$_{0.62}$ using the Tauc equation for amorphous materials to yield E$_{g-opt}$≈2.1 eV, and corresponding $\lambda_{Eg}$=590 nm 51, followed by fitting of the absorption coefficient of a-SiN$_{0.62}$ as a function of wavelength from 250 nm to $\lambda_{Eg}$=590 nm, using the Tauc equation 50. The resulting predicted absorption as a function of wavelength curve for HFCVD deposited a-SiN$_{0.62}$ 50 yields an absorption coefficient at 250 nm of α≈1×10$^5$ l/cm. This worst case result confirms that for the a-SiN$_{0.62}$ component of the antireflective bilayer (from FIG. 446) if the thickness of the layer is maintained below 50 nm, the absorption losses in the layer can be disregarded.

Figure 6:
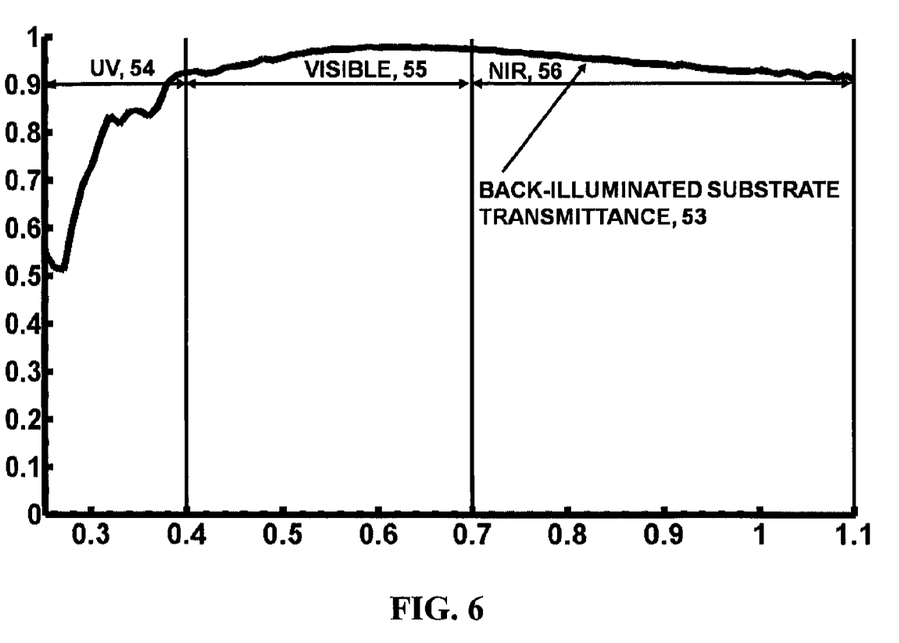
FIG. 6 is the calculated, optical transmittance of the back-illuminated silicon-(AlN/a-SiN$_{0.62}$)-sapphire wafer substrate with $\lambda/4$-MgF$_2$ back-side antireflective layer from FIG. 1, showing transmittance T>50% for 250-300 nm light, T>70% for 300-400 nm light and T>90% for 400-1100 nm light.

Referring now to FIG. 6, the back-illuminated, optical transmittance 53 of the silicon-(AlN/a-SiN$_{0.62}$)-sapphire substrate with λ/4-MgF$_2$ back-side antireflective layer from FIG. 1, is calculated using Monte Carlo integration and the wave transfer/scattering matrix method. For optimized material layer thicknesses in the antireflective bilayer of 52 nm for AlN and 30 nm for a-SiN$_{0.62}$, a sapphire substrate thickness of 50 μm and 120 nm thick λ/4-MgF$_2$ back-side antireflective layer, the result clearly shows high back-illuminated optical transmittance 53 from 250-1100 nm. The back-illuminated optical transmittance in the ultraviolet 54 exhibits T>50% for 250-300 nm, T>70% for 300-400 nm and T>90% from 400-1100 nm in the visible 55 and near infrared 56 regions of the electromagnetic spectrum.

With further adjustment of the material layer thicknesses including AlN, a-SiN$_{0.62}$ and MgF$_2$ shown in FIG. 1, it is possible to optimize the back-illuminated optical transmittance 53 of the Si—(AlN/a-SiN$_{0.62}$)-sapphire with λ/4-MgF$_2$ back-side antireflective layer to provide improved optical transmittance over specific wavelength ranges such as ultraviolet 54, visible 55, and near infrared 56. For example, an enhanced, nearly 100% back-illuminated optical transmittance can be achieved in the ultraviolet 54, at the cost of a reduced back-illuminated transmittance in the visible 55 and near infrared 56 wavelengths.

Figure 7:
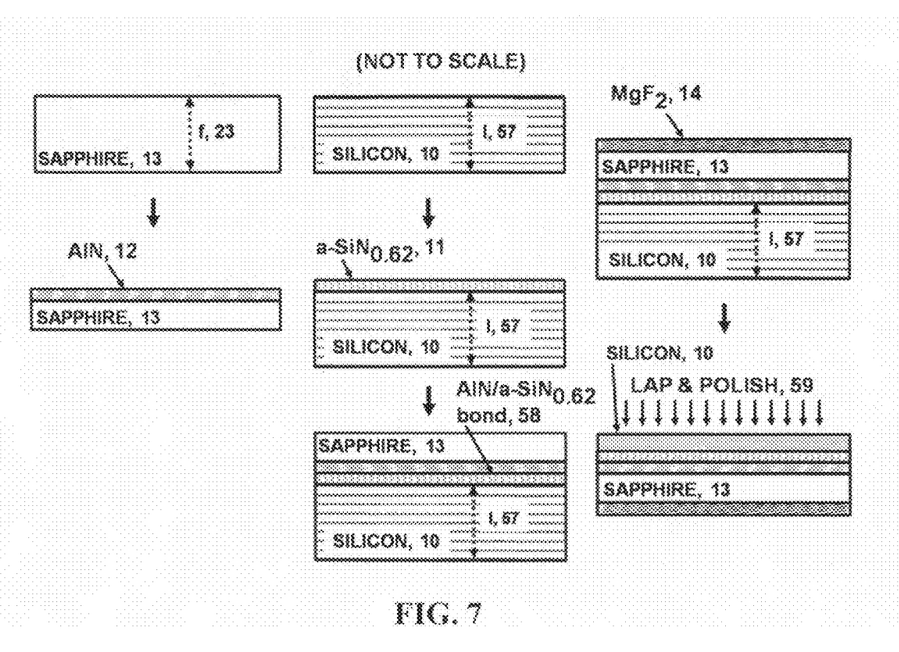
FIG. 7 illustrates the sequence of fabrication steps that can be used to implement or manufacture the very high transmittance, back-illuminated, silicon-(AlN/a-SiN$_{0.62}$)-sapphire wafer substrate with $\lambda/4$-MgF$_2$ back-side antireflective layer from FIG. 1.

Referring to FIG. 7, the fabrication process for high transmittance, back-illuminated, silicon-(AlN/a-SiN$_{0.62}$)-sapphire substrate with λ/4-MgF$_2$ back-side antireflective layer is depicted up to and including thinning of the silicon semiconductor active device layer by lapping and polishing, and before the anisotropic etching step of the silicon mesa array and the subsequent fabrication of the APDs. In one embodiment of the fabrication process for high transmittance, back-illuminated, silicon-(AlN/a-SiN$_{0.62}$)-sapphire substrate with λ/4-MgF$_2$ back-side antireflective layer, the starting sapphire wafer substrate 13 is thinned by lapping and polishing means to thickness f=50 μm 23. The sapphire wafer substrate 13 crystal orientation can be either R-plane or C-plane for example. The single crystal aluminum nitride (AlN) material layer component 12, of the (AlN/a-SiN$_{0.62}$) antireflective bilayer is grown epitaxially to an appropriate thickness of 52 nm on the front surface of the thinned sapphire wafer substrate 13. The resulting single crystal AlN orientation can be A-plane if grown on R-plane sapphire or C-plane AlN if grown on C-plane sapphire. A full thickness l=750 μm 57, (100) silicon semiconductor wafer substrate 10 is used to deposit the 30 nm thick non-stoichiometric, silicon rich, amorphous a-SiN$_{0.62}$ 11 material layer component of the (AlN/a-SiN$_{0.62}$) antireflective bilayer. The a-SiN$_{0.62}$ 11 face of the (100) silicon wafer substrate 10, is wafer bonded 58 to the AlN 12 face of the 50 μm thick sapphire wafer substrate 13 using an appropriate gas ambient such as oxygen, to help effect good molecular adhesion between the a-SiN$_{0.62}$ 11 layer and AlN 12. A 120 nm thick λ/4-MgF$_2$ 14 antireflective layer, can be deposited on the back surface of the thinned sapphire substrate 13 to provide refractive index matching between the ambient or air and sapphire 13. The full thickness (100) silicon wafer 10 can be subsequently thinned by lapping and polishing 59 for example, to an appropriate thickness of l=10-50 μm 57 to support fabrication of solid-state detector devices.

In summary, a novel method for implementing a very high transmittance, back-illuminated silicon-(AlN/a-SiN$_{0.62}$)-sapphire substrate with λ/4-MgF$_2$ back-side antireflective layer, for enabling large scale, high quantum efficiency and high resolution APD imaging focal plane arrays has been presented and described. The said very high transmittance, back-illuminated, silicon-on-sapphire substrate design enables large scale arrays of high sensitivity and wide dynamic range silicon and silicon germanium APD-FPAs operating in dual linear mode and Geiger-mode, and also other types of back-illuminated, solid-state light detectors including CCDs and CMOS-APS devices. The previous limitations in the design of solid-state, back-illuminated, silicon APD imaging focal plane arrays have been overcome with the novel silicon-on-sapphire semiconductor wafer substrate design presented and described here, that supports very high optical transmittance into silicon and supports the fabrication monolithic sapphire microlenses that focus light under the full height of silicon detector mesas for high quantum efficiency and high sensitive-area-fill-factor arrays, and also supports an effective means for optical crosstalk isolation between adjacent detectors, thereby enabling high resolution arrays.

The invention claimed is:

1. An all solid-state, monolithic, back-illuminated, semiconductor wafer substrate apparatus for transmitting ultraviolet, visible and near infrared radiation into the semiconductor layer with efficiency approaching 100%, comprising:
   a silicon (Si) or silicon-germanium (SiGe) semiconductor layer, wherein said silicon (Si) or silicon-germanium (SiGe) semiconductor layer comprises light detector elements (pixels) for imaging focal plane arrays, detecting radiation in the ultraviolet, visible and near infrared; and
   a sapphire dielectric layer for providing mechanical support to said silicon (Si) or silicon-germanium (SiGe) semiconductor layer, and also transmitting ultraviolet, visible and near infrared radiation; and
   an antireflective bilayer wherein said antireflective bilayer comprises a single crystal aluminum nitride (AlN) antireflective layer and also a non-stoichiometric, silicon rich, amorphous silicon nitride (a-SiN$_{x<1.33}$) antireflective layer, said single crystal aluminum nitride (AlN) antireflective layer disposed between said sapphire dielectric layer and said non-stoichiometric, silicon rich, amorphous silicon nitride (a-SiN$_{x<1.33}$) antireflective layer and said non-stoichiometric, silicon rich, amorphous silicon nitride (a-SiN$_{x<1.33}$) antireflective layer disposed between said single crystal aluminum nitride (AlN) antireflective layer and said silicon (Si) or silicon-germanium (SiGe) semiconductor layer, for providing refractive index matching between said sapphire dielectric layer and said silicon (Si) or silicon-germanium (SiGe) semiconductor layer to transmit ultraviolet, visible and near infrared radiation from said sapphire dielectric layer into said silicon (Si) or silicon-germanium (SiGe) semiconductor layer with efficiency approaching 100%; and
   a single one quarter wavelength thick, amorphous magnesium fluoride (MgF$_2$) antireflective layer disposed between the ambient (air) and said sapphire dielectric layer for providing refractive index matching between said ambient (air) and said sapphire dielectric layer to transmit ultraviolet, visible and near infrared radiation from said ambient (air) into said sapphire dielectric layer with efficiency approaching 100%.

2. The apparatus of claim 1, wherein said single crystal aluminum nitride (AlN) antireflective layer has C-plane orientation if deposited on C-plane sapphire and wherein said single crystal aluminum nitride (AlN) antireflective layer has A-plane orientation if deposited on R-plane sapphire.

3. The apparatus of claim 1, wherein said non-stoichiometric, silicon rich, amorphous silicon nitride (a-SiN$_{x<1.33}$)antireflective layer has optimal nitrogen to silicon ratio (N:Si) X=0.62.

4. The apparatus of claim 1, wherein said non-stoichiometric, silicon rich, amorphous silicon nitride (a-SiN$_{x<1.33}$) antireflective layer has thickness of 30 nanometers.

5. The apparatus of claim 1, wherein said single crystal aluminum nitride (AlN) antireflective layer has thickness of 52 nanometers.

6. The apparatus of claim 1, wherein said single one quarter wavelength thick, amorphous magnesium fluoride (MgF$_2$) antireflective layer has thickness of 120 nanometers.

7. The apparatus of claim 1, wherein said silicon (Si) or silicon-germanium (SiGe) semiconductor layer has thickness of 10 micrometers.

8. The apparatus of claim 1, wherein said sapphire dielectric layer has thickness of 50 micrometers.

9. The apparatus of claim 1, wherein said all solid-state, monolithic, back-illuminated, semiconductor wafer substrate optical transmittance into said silicon (Si) or silicon-germanium (SiGe) semiconductor layer is greater than 50% for wavelength 250<λ<400 nanometers and greater than 90% for wavelength 400<λ<1100 nanometers.

* * * * *